United States Patent
Dempsey

(10) Patent No.: US 10,331,117 B2
(45) Date of Patent: Jun. 25, 2019

(54) SYSTEM AND METHOD OF MONITORING PERFORMANCE OF AN HVAC UNIT

(71) Applicant: Carrier Corporation, Farmington, CT (US)

(72) Inventor: Daniel J. Dempsey, Carmel, IN (US)

(73) Assignee: CARRIER CORPORATION, Farmington, CT (US)

( * ) Notice: Subject to any disclaimer, the term of this patent is extended or adjusted under 35 U.S.C. 154(b) by 219 days.

(21) Appl. No.: 15/219,108

(22) Filed: Jul. 25, 2016

(65) Prior Publication Data

US 2017/0023934 A1 Jan. 26, 2017

Related U.S. Application Data

(60) Provisional application No. 62/196,665, filed on Jul. 24, 2015.

(51) Int. Cl.
| | |
|---|---|
| *G05B 23/02* | (2006.01) |
| *F24F 5/00* | (2006.01) |
| *F24F 11/30* | (2018.01) |
| *G01R 22/06* | (2006.01) |
| *G01R 31/02* | (2006.01) |

(Continued)

(52) U.S. Cl.
CPC ........ *G05B 23/0235* (2013.01); *F24F 5/0046* (2013.01); *F24F 11/30* (2018.01); *G01R 22/063* (2013.01); *G01R 31/02* (2013.01); *F24F 11/46* (2018.01); *F24F 11/58* (2018.01); *F24F 2110/10* (2018.01); *F24F 2110/12* (2018.01);

(Continued)

(58) Field of Classification Search
CPC ............. G01R 31/021; G01R 31/2829; G01R 31/343; G01R 31/02; G01R 31/025
USPC .......................................................... 324/511
See application file for complete search history.

(56) References Cited

U.S. PATENT DOCUMENTS 5,073,862 A * 12/1991 Carlson ................. F25B 49/005
702/185
5,159,319 A 10/1992 Dunk et al.
(Continued)

FOREIGN PATENT DOCUMENTS

| CA | 2344908 A1 | 1/2002 |
|---|---|---|
| JP | S63302238 A | 12/1988 |

(Continued)

OTHER PUBLICATIONS

Cho, Sung-Hwan, et al. "Transient pattern analysis for fault detection and diagnosis of HVAC systems." Energy Conversion and Management 46.18-19 (2005): 3103-3116.*

Primary Examiner — Christopher P McAndrew
(74) Attorney, Agent, or Firm — Cantor Colburn LLP

(57) ABSTRACT

A system and method for monitoring performance of an HVAC unit by receiving outdoor temperature data from an outdoor temperature source and indoor temperature data from an indoor temperature source, tracking performance data of the HVAC unit based at least in part on the outdoor temperature data and the indoor temperature data, receiving power consumption data from the power measuring device, tracking the power consumption data based at least in part on the outdoor temperature data, determining whether there is a change in the performance data and the power consumption data, and generating a fault signal based at least in part on the change in the performance data and the power consumption data.

14 Claims, 4 Drawing Sheets

(51) Int. Cl.
   *F24F 11/46*    (2018.01)
   *F24F 11/58*    (2018.01)
   *F24F 110/10*   (2018.01)
   *F24F 110/12*   (2018.01)
   *F24F 130/00*   (2018.01)
   *F24F 130/10*   (2018.01)
   *F24F 140/60*   (2018.01)

(52) U.S. Cl.
   CPC ....... *F24F 2130/00* (2018.01); *F24F 2130/10* (2018.01); *F24F 2140/60* (2018.01)

(56) References Cited

U.S. PATENT DOCUMENTS

| | | | |
|---|---|---|---|
| 5,754,450 A | 5/1998 | Solomon et al. | |
| 6,694,766 B1 * | 2/2004 | Johnson, Jr. | F01K 3/185 62/238.4 |
| 7,274,973 B2 | 9/2007 | Nichols et al. | |
| 7,359,167 B2 | 4/2008 | Elms | |
| 8,127,566 B2 * | 3/2012 | Hammond | F25B 30/02 62/260 |
| 8,161,765 B2 * | 4/2012 | Marois | F25B 30/02 62/333 |
| 8,180,492 B2 * | 5/2012 | Steinberg | G05D 23/1902 700/276 |
| 8,550,368 B2 | 10/2013 | Butler et al. | |
| 8,596,550 B2 * | 12/2013 | Steinberg | G05B 19/0426 236/1 C |
| 8,740,100 B2 * | 6/2014 | Steinberg | F24F 11/0001 236/46 C |
| 8,756,943 B2 * | 6/2014 | Chen | F25B 13/00 62/160 |
| 8,997,511 B2 * | 4/2015 | Berrio | F24D 11/004 62/235.1 |
| 2010/0051710 A1 | 3/2010 | Kissinger | |
| 2013/0116953 A1 | 5/2013 | Pollard et al. | |
| 2014/0074730 A1 | 3/2014 | Arensmeier et al. | |
| 2014/0188294 A1 | 7/2014 | Hassin | |
| 2014/0262130 A1 | 9/2014 | Yenni et al. | |
| 2014/0375304 A1 | 12/2014 | Holce et al. | |

FOREIGN PATENT DOCUMENTS

| | | |
|---|---|---|
| KR | 20040054415 A | 6/2004 |
| KR | 20070077641 A | 7/2007 |

\* cited by examiner

SYSTEM AND METHOD OF MONITORING PERFORMANCE OF AN HVAC UNIT

CROSS-REFERENCE TO RELATED APPLICATIONS

The present application is a non-provisional of, and claims priority to, U.S. Provisional Patent Application Ser. No. 62/196,665, filed Jul. 24, 2015, and titled "SYSTEM AND METHOD OF MONITORING PERFORMANCE OF AN HVAC UNIT", which is herein incorporated by reference in its entirety.

TECHNICAL FIELD OF THE DISCLOSED EMBODIMENTS

The presently disclosed embodiments generally relate to appliances for cooling air, and more particularly, to a system and method for monitoring performance of an HVAC component.

BACKGROUND OF THE DISCLOSED EMBODIMENTS

Generally, traditional, non-communicating HVAC systems are not capable of displaying faults that may occur in the units that make up the system. In order to display faults, accessory systems including a number of different sensors are retrofitted on the HVAC units that are capable of measuring the performance of the units. These accessory systems typically increase the costs and install time of the HVAC system due to the number of sensors.

Accordingly, there exists a need for a system and method to display faults without significantly increasing the cost and install time of the HVAC system.

SUMMARY OF THE DISCLOSED EMBODIMENTS

In one aspect, an HVAC system is provided. The HVAC system includes a system controller including a processor in communication with a memory, and an indoor temperature sensor disposed therein. The HVAC system further includes an indoor HVAC unit and an outdoor HVAC unit in communication with the system controller. In some embodiments, the outdoor HVAC unit may include an outdoor controller.

The indoor HVAC unit and the outdoor HVAC unit are in electrical communication with an electrical panel via at least one indoor wire, and at least one outdoor wire, respectively. The electrical panel is operable to provide power to the HVAC system.

The HVAC system further includes a power measuring device operably coupled to the at least one outdoor wire and in communication with the system controller. The power measuring device is configured to measure the power consumption of the indoor HVAC unit and/or outdoor HVAC unit during operation. In an embodiment, the power measuring device may communicate with the system controller via a wired or wireless connection.

The HVAC system further includes an outdoor temperature sensor in communication with the system controller. The outdoor temperature sensor is configured to measure the outdoor temperature, and transmit that data to the system controller.

In one aspect, a method of monitoring performance of an HVAC unit is provided. The method includes the step of receiving outdoor temperature data from an outdoor temperature source. In an embodiment, the outdoor temperature source includes at least one of an outdoor temperature sensor and a secondary source. In one embodiment, the secondary source is configured to supply up to date, but not necessarily instantaneous, outdoor temperature data. In another embodiment, the system controller operates a communication module to access an external weather website, or other sources, to acquire outdoor temperature data based upon the location of the HVAC system.

The method further includes the step of tracking performance data of the outdoor HVAC unit based at least upon the outdoor temperature data. In an embodiment, performance data includes at least one of capacity, run-time, load, and duty cycle.

The method further includes the steps of receiving power consumption data from the power measuring device, and determining whether there is a change in the performance data based at least in part on the outdoor temperature data. If there is a change in the performance data at the same outdoor temperature, the method proceeds to the step of analyzing the power consumption data from the power measuring device.

The method further includes the step of generating a fault signal if it is determined that there is a change in the performance data and the associated power consumption data. In an embodiment, the method further includes the step of transmitting the fault signal to a secondary device. In an embodiment, the secondary device includes at least one of a mobile device and a database.

DETAILED DESCRIPTION OF THE DISCLOSED EMBODIMENTS

Figure 1:
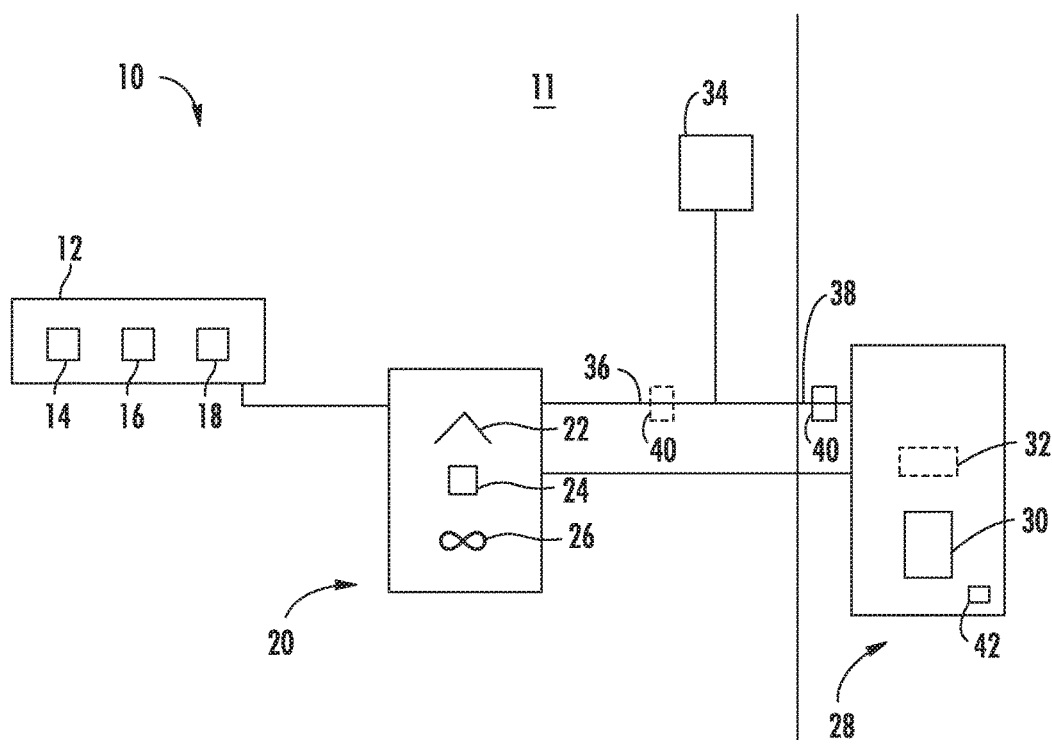
FIG. 1 illustrates a schematic diagram of a HVAC system according to an embodiment of the present disclosure.

For the purposes of promoting an understanding of the principles of the present disclosure, reference will now be made to the embodiments illustrated in the drawings, and specific language will be used to describe the same. It will nevertheless be understood that no limitation of the scope of this disclosure is thereby intended.

FIG. 1 schematically illustrates an embodiment of an HVAC system, generally indicated at 10, configured to condition air within an interior space 11. The HVAC system 10 includes a system controller 12 including a processor 14 in communication with a memory 16, and an indoor temperature sensor 18 disposed therein. It will be appreciated that the temperature sensor 18 may be external of the system controller 12. It will further be appreciated that the memory 16 may also be external to the system controller 12, for example, on an external server.

The HVAC system 10 further includes an indoor HVAC unit 20 in communication with the system controller 12. In the illustrated, non-limiting embodiment, the indoor HVAC unit 20 is a fan coil containing an evaporator coil 22, and an indoor controller 24 in communication with an indoor fan assembly 26. It will be appreciated that the indoor HVAC unit 20 may also include a furnace and evaporator coil combination, and a geothermal heat pump to name a couple of non-limiting example.

The HVAC system 10 further includes an outdoor HVAC unit 28 in communication with the indoor HVAC unit 20. In the illustrated, non-limiting embodiment, the outdoor HVAC unit 28 is an air conditioner containing a compressor 30. In some embodiments, the outdoor HVAC unit 28 may include an outdoor controller 32. It will be appreciated that the outdoor HVAC unit 28 may also include a heat pump, or packaged unit to name few non-limiting examples.

The indoor HVAC unit 20 and the outdoor HVAC unit 28 are in electrical communication with an electrical panel 34 via at least one indoor wire 36, and at least one outdoor wire 38, respectively. The electrical panel 34 is operable to provide power to the HVAC system 10.

The HVAC system 10 further includes a power measuring device 40 operably coupled to the at least one outdoor wire 38 and in communication with the system controller 12. For example, the power measuring device 40 may include a voltage sensor, current sensor, current transformer clamp, and a hall effect sensor to name a few non-limiting examples. The power measuring device 40 is configured to measure the power consumption of the indoor HVAC unit 20 and/or outdoor HVAC unit 28 during operation.

In an embodiment, the power measuring device 40 may communicate with the system controller 12 via a wired or wireless connection. It will be appreciated that the power measuring device 40 may be in communication with one or both of the indoor controller 24, and the outdoor controller 32.

The HVAC system 10 further includes an outdoor temperature sensor 42 in communication with the system controller 12. The outdoor temperature sensor 42 is configured to measure the outdoor temperature, and transmit that data to the system controller 12. It will be appreciated that the outdoor temperature sensor 42 may be an integral component of the outdoor HVAC unit 28, or it may be external. It will further be appreciated that the outdoor temperature sensor 42 may also be in communication with the outdoor controller 32 and/or the indoor controller 24.

In normal operation to condition an interior space, the compressor 30 is fluidically coupled to the evaporator coil 22. Compressed refrigerant flows through the evaporator coil 22. As the refrigerant flows through the evaporator coil 22, the indoor fan assembly 26 operates to circulate conditioned air through a supply conduit (not shown) to the interior space 11.

Figure 2:
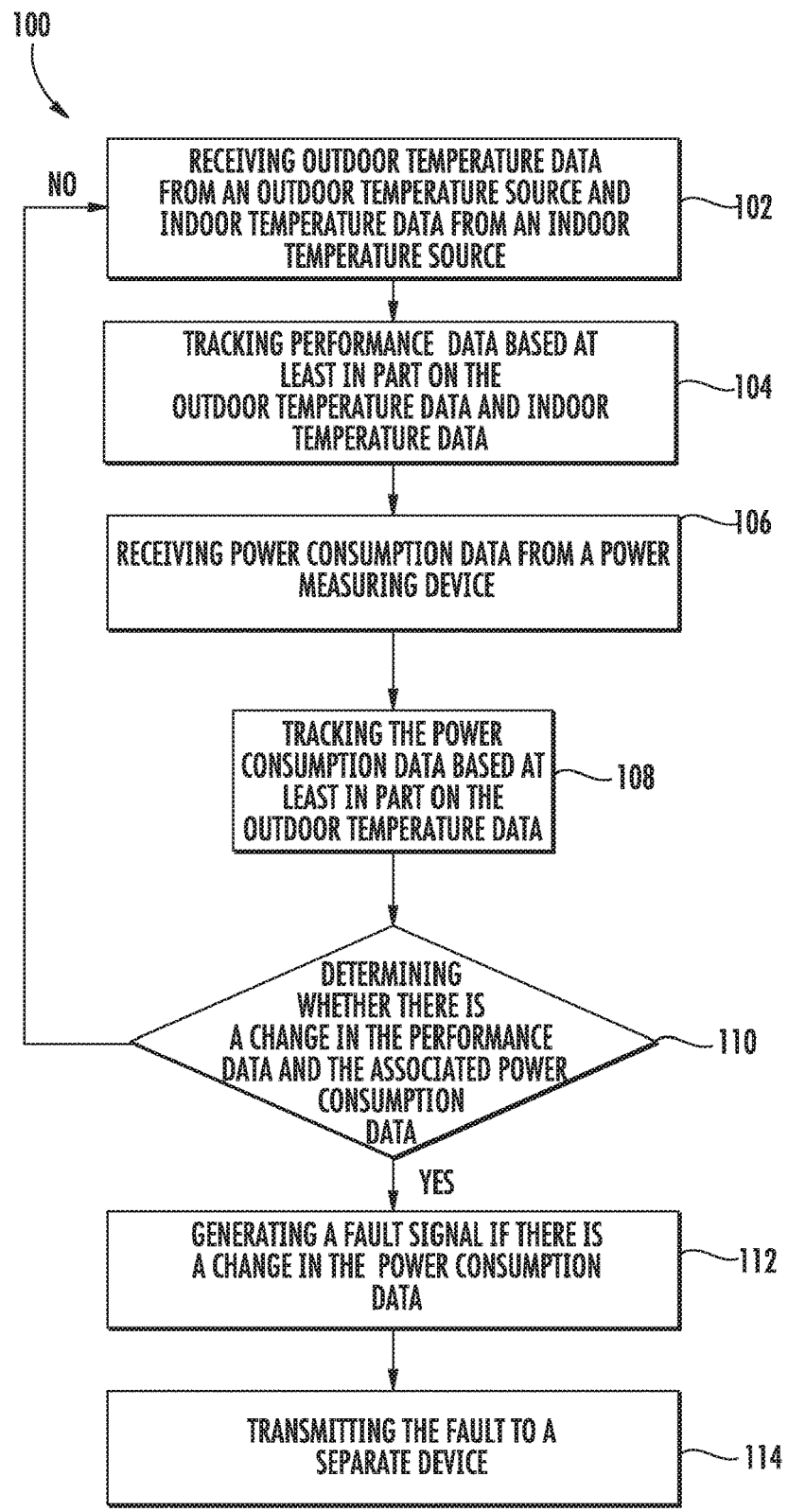
FIG. 2 illustrates a schematic flow diagram of a method for monitoring performance of an HVAC system according to one embodiment of the present disclosure.

FIG. 2 illustrates a method of monitoring performance of an HVAC unit, the method generally indicated at 100. The method includes step 102 of receiving outdoor temperature data from an outdoor temperature source. In an embodiment, the outdoor temperature source includes at least one of the outdoor temperature sensor 40 and a secondary source. In one embodiment, the secondary source is configured to supply up to date, but not necessarily instantaneous, outdoor temperature data. It will be appreciated that the secondary source may include a website, or a live feed, or any other source capable of supplying up to date, but not necessarily instantaneous, temperature data to name a few of non-limiting examples.

For example, with continued reference to FIG. 1, the outdoor temperature sensor 42 operates to measure the outdoor temperature as the HVAC system 10 is operating to meet the target indoor temperature. In another embodiment, the system controller 12 operates a communication module (not shown) to access an external weather website (e.g. the National Oceanic and Atmospheric Administration to name one non-limiting example), or other sources, to acquire outdoor temperature data based upon the location of the HVAC system 10.

The method 100 further includes step 104 of tracking performance data of the outdoor HVAC unit 28 based at least upon the outdoor temperature data. In an embodiment, performance data includes at least one of capacity, run-time, load, and duty cycle. For example, with reference to FIG. 1, a user operates the HVAC system 10 by operating the system controller 12 (e.g. a thermostat) to set a target indoor temperature within the interior space 11. The system controller 12 operates the indoor HVAC unit 20 and/or the outdoor HVAC unit 28 in either a heating or cooling mode to condition the air in order to satisfy the target indoor temperature within the interior space 11. As the air is conditioned, the indoor temperature sensor 18 measures the temperature of the surrounding air and transmits the data to the system controller 12.

The HVAC system 10 generally employs a conventional on/off control scheme that cycles the indoor HVAC unit 20 and/or outdoor HVAC unit 28 on and off to maintain the actual indoor temperature at or near the target indoor temperature. Generally, the greater the difference between the outdoor temperature and the target indoor temperature, the closer the indoor HVAC unit 20 and/or outdoor HVAC unit 28 must operate at its maximum capacity of 100%. For an on/off control scheme, the capacity of the indoor HVAC unit 20 and/or outdoor HVAC unit 28 is in terms of duty cycle (i.e., the percentage of time that the indoor HVAC unit 20 and/or outdoor HVAC unit 28 is running: (on-time)/(on-time+off-time)). System controller 12 determines and periodically records the performance data, for example duty cycle to name one non-limiting example, at various outdoor temperature values.

The method 100 further includes step 106 of receiving power consumption data from the power measuring device 40. For example, as the outdoor HVAC unit 28 operates to condition the air within the interior space 11, the power measuring device 40 may be clamped around the outdoor wire 38 to measure the power consumption of the outdoor HVAC unit 28 during operation. For example, the current flowing through the outdoor wire 38 is converted to voltage by the power measuring device 40 via a measurement of the magnetic flux generated by the outdoor wire 38.

Figure 3:
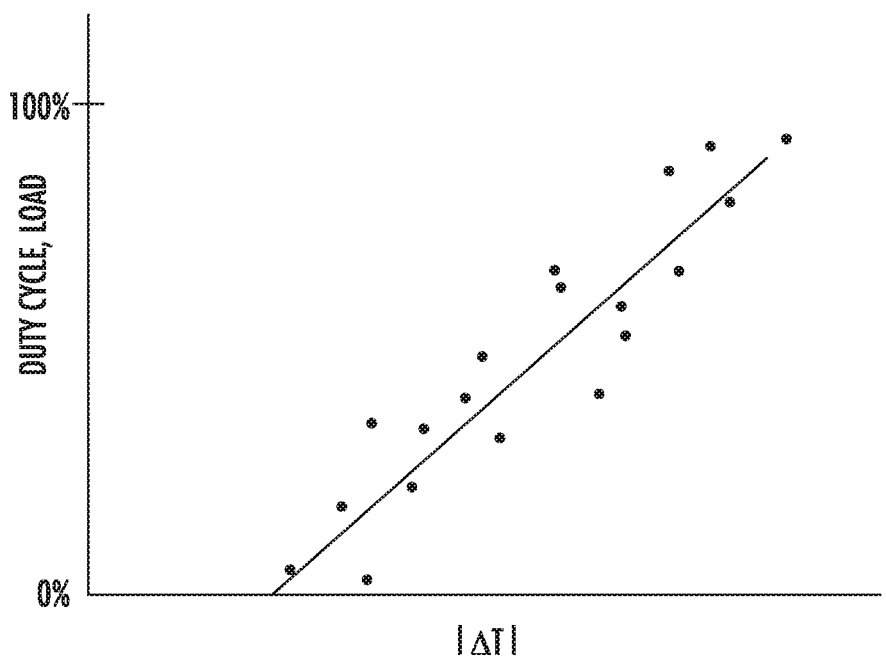
FIG. 3 illustrates a graph of performance data for an HVAC unit according to an embodiment of the present disclosure.

The method 100 further includes step 108 of determining whether there is a change in the performance data. An example of the performance data versus various different temperature-related measurements is graphically shown in FIGS. 3-5. The graph in FIG. 3 illustrates duty cycle on the Y-axis and the absolute difference between outdoor air temperature and indoor air temperature. As enough data points are acquired (over a period of days, weeks, months, etc.), a line may be curve fitted and a representative slope of the duty cycle is determined by the processor 14. The curve fitting process may create a linear relationship between the duty cycle and difference between outdoor air temperature and indoor air temperature. In one embodiment, the relationship could be a curve or any other desired mathematical function. This data acquisition process can be completed shortly after the HVAC unit 28 is installed in a consumer's home, performed at the factory, uploaded from a database of relationship data, or determined in any other desired way.

Figure 4:
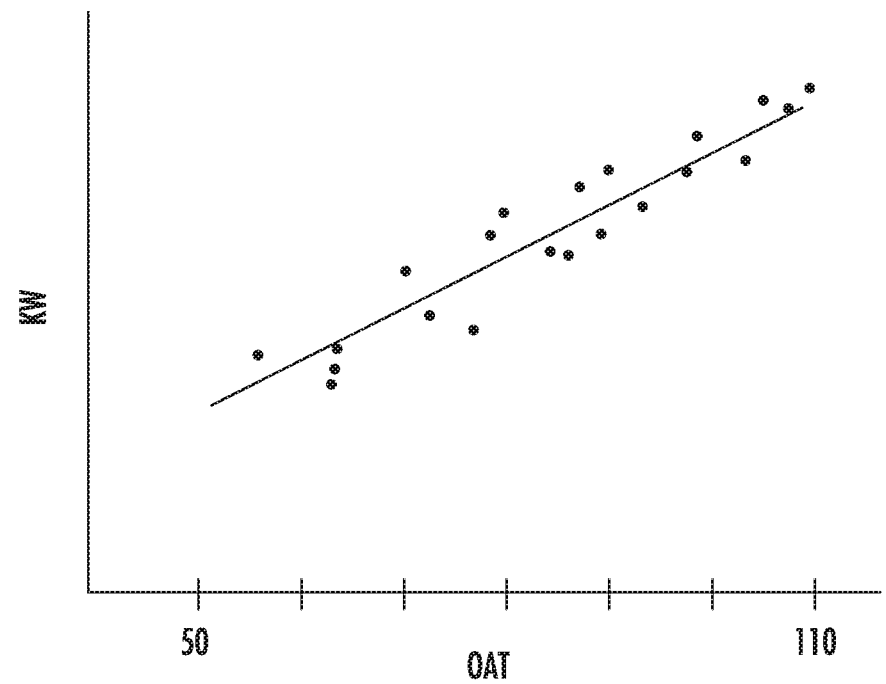
FIG. 4 illustrates a graph of performance data for an HVAC unit according to an embodiment of the present disclosure.
Figure 5:
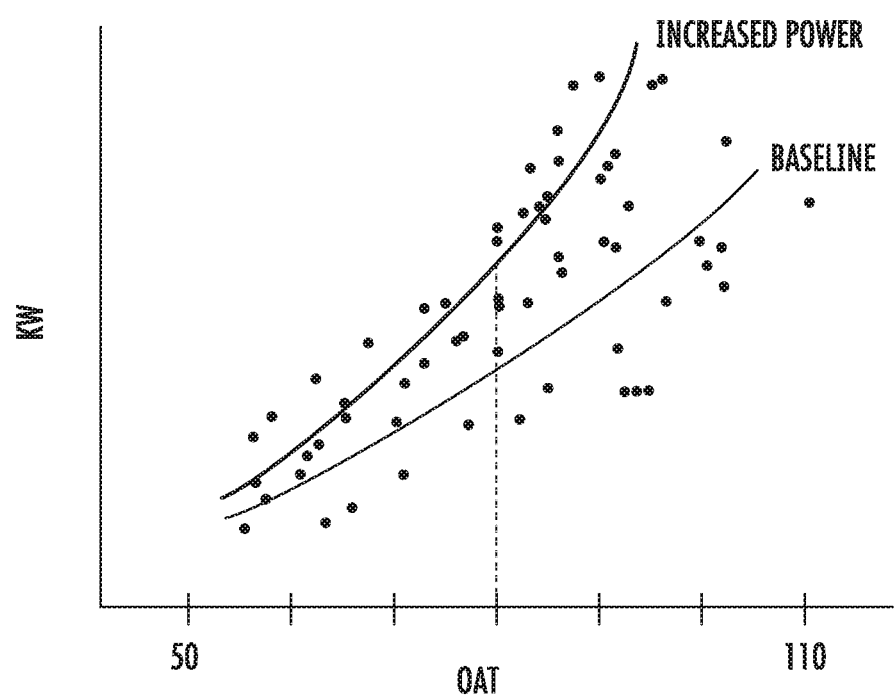
FIG. 5 illustrates a graph of performance data for an HVAC unit according to an embodiment of the present disclosure.

FIGS. 4-5 illustrate power consumed by the outdoor unit 28 on the Y-axis and the outdoor air temperature on the X-axis. As enough data points are acquired over a period of time, a straight line or curved line can be fitted and a representative slope of the power is determined by the processor 14. In one embodiment, the relationship could be any other desired mathematical function. This data acquisition process can be completed shortly after the HVAC unit 28 is installed in a consumer's home, performed at the factory, uploaded from a database of relationship data, or determined in any other desired way.

If there is a change in the performance data at the same outdoor temperature, for example, if the duty cycle increases or decreases as a function of the difference between the outdoor air temperature and the indoor air temperature, the method 100 proceeds to step 110 of analyzing the power consumption data from the power measuring device 40.

For example, if over the period in which data points are captured for curve-fitting, the duty cycle line slope (FIG. 3) increases and the slope of the power line (FIGS. 4-5) increases for the same outdoor temperature value, it may be indicative of a dirty or corroded condenser coil fault. In another example, if the duty cycle line slope increases and the slope of the power line decreases, it may be indicative of a reduced refrigerant charge fault. Additionally, if the duty cycle line slope decreases slightly with a corresponding increase in power slope, it may be indicative of an increased refrigerant charge fault.

As another non-limiting illustration, a problem may be indicated where the initial performance data indicated a 40% duty cycle at a 10 degree indoor/outdoor temperature difference, but the current data indicated a 60% duty cycle at the same 10 degree indoor/outdoor temperature difference. As another example, a problem may be indicated where the initial performance data indicated 2.5 kW of energy usage at an outdoor air temperature of 85 degrees F., but the current data indicated a 2.8 kW duty cycle at the same outdoor air temperature of 85 degrees F.

The method further includes step 112 of generating a fault signal if it is determined that there is a change in the performance data and the associated power consumption data. In an embodiment, the method 100 further includes step 114 of transmitting the fault signal to a secondary device. In an embodiment, the secondary device includes at least one of a mobile device and a database. For example, the system controller 12 may transmit the fault signal to a mobile phone, tablet device or any device a capable of being carried outside of a home. The system controller 12 may also transmit the fault signal to database such that service personnel may access the fault signal from a desktop computer or other similar devices.

In one embodiment, a geothermal heat pump may be used in addition to or in place of the outdoor HVAC unit 28 and or indoor HVAC unit 20. In such an embodiment, with respect to the geothermal heat pump component, the power consumption of the geothermal heat pump would be tracked and compared to the water temperature returning from the geothermal heat pump's ground loop, instead of the outdoor air temperature.

It will therefore be appreciated that while the above embodiments were described with respect to the outdoor HVAC unit 28, the power measuring device may be operably coupled to the indoor HVAC unit 20, the outdoor HVAC unit 28, or both in communication with the system controller 12 to monitor the power consumption of the corresponding indoor HVAC unit 20 and/or the outdoor HVAC unit 28. By monitoring the power consumption of the of the indoor HVAC unit 20, the outdoor HVAC unit 28, or both, the system controller 12 may detect a change in performance data of the HVAC system 10 in relation to outdoor temperature data.

While the invention has been illustrated and described in detail in the drawings and foregoing description, the same is to be considered as illustrative and not restrictive in character, it being understood that only certain embodiments have been shown and described and that all changes and modifications that come within the spirit of the invention are desired to be protected.

What is claimed is:

1. A method of monitoring performance of an HVAC unit operably coupled to a power measuring device, the method comprising:
    (a) receiving outdoor temperature data from an outdoor temperature source and indoor temperature data from an indoor temperature source;
    (b) tracking performance data of the HVAC unit based at least in part on the outdoor temperature data and the indoor temperature data;
    (c) receiving power consumption data from the power measuring device;
    (d) tracking the power consumption data based at least in part on the outdoor temperature data;
    (e) determining whether there is a change in the performance data and the power consumption data; and
    (f) generating a fault signal based on the change in the performance data and the power consumption data.

2. The method of claim 1, further comprising:
    (g) communicating the fault to a separate device.

3. The method of claim 1, wherein the performance data comprises at least one of capacity, run-time, load, and duty cycle.

4. The method of claim 1, wherein the outdoor temperature source comprises at least one of an outdoor temperature sensor and a secondary source.

5. The method of claim 2, wherein the separate device comprises at least one of a mobile device and a database.

6. The method of claim 4, wherein the secondary source comprises a website.

7. The method of claim 1, wherein the outdoor temperature data is the temperature of water returning from a ground loop of a geothermal heat pump.

8. An HVAC system comprising:
    a system controller including a processor, and a memory;
    an HVAC unit in communication with the system controller; and
    a power measuring device operably coupled to the HVAC unit, and in communication with the system controller;
    wherein the processor is configured to:
        (a) receive outdoor temperature data from an outdoor temperature source and indoor temperature data from an indoor temperature source;
        (b) track performance data of the HVAC unit based at least in part on the outdoor temperature data and the indoor temperature data;
        (c) receive power consumption data from the power measuring device;
        (d) track the power consumption data based at least in part on the outdoor temperature data;
        (e) determine whether there is a change in the performance data and the power consumption data; and (f) generate a fault signal based on the change in the performance data and the power consumption data.

9. The HVAC system of claim 8, wherein the system controller is configured to transmit the fault signal to a separate device.

10. The HVAC system of claim 8, wherein the outdoor temperature source comprises at least one of a temperature sensor and a secondary source.

11. The HVAC system of claim 8, wherein the performance data comprises at least one of capacity, run-time, load, and duty cycle.

12. The HVAC system of claim 9, wherein the separate device comprises at least one of a mobile device and a database.

13. The HVAC system of claim 10, wherein the secondary source is configured to supply up to date, but not necessarily instantaneous, outdoor temperature data.

14. The HVAC system of claim 8, wherein the outdoor temperature data is the temperature of water returning from a ground loop of a geothermal heat pump.

\* \* \* \* \*